United States Patent [19]
Yoshitake et al.

[11] Patent Number: 5,929,452
[45] Date of Patent: Jul. 27, 1999

[54] ELECTROSTATIC DEFLECTING ELECTRODE UNIT FOR USE IN CHARGED BEAM LITHOGRAPHY APPARATUS AND METHOD OF MANUFACTURE THE SAME

[75] Inventors: Shusuke Yoshitake, Yokohama; Hiroaki Hirazawa, Tokyo; Shigeru Wakayama, Yokohama, all of Japan

[73] Assignee: Kabushiki Kaisha Toshiba, Kawasaki, Japan

[21] Appl. No.: 09/042,809

[22] Filed: Mar. 17, 1998

[30] Foreign Application Priority Data

Mar. 18, 1997 [JP] Japan ................................. 9-064935

[51] Int. Cl.$^6$ ................................................. H01J 37/147
[52] U.S. Cl. ............................................................ 250/396 R
[58] Field of Search ............................... 250/396 R, 398, 250/492.2

[56] References Cited

U.S. PATENT DOCUMENTS 5,770,862  6/1998  Ooaeh et al. ........................ 250/396 R

FOREIGN PATENT DOCUMENTS

| | | |
|---|---|---|
| 63-55744 | 11/1988 | Japan . |
| 2-123651 | 5/1990 | Japan . |
| 2-247966 | 10/1990 | Japan . |
| 4-174510 | 6/1992 | Japan . |
| 5-29201 | 2/1993 | Japan . |
| 5-129193 | 5/1993 | Japan . |
| 5-266847 | 10/1993 | Japan . |

*Primary Examiner*—Kiet T. Nguyen
*Attorney, Agent, or Firm*—Oblon, Spivak, McClelland, Maier & Neustadt, P.C.

[57] ABSTRACT

A method of manufacturing an electrostatic deflecting electrode unit for use in charged beam lithography apparatus comprises a first step of preparing a hollow cylindrical member made of metal, a second step of forming grooves of a predetermined width in a cylindrical member in the direction of radius thereof and along lines that equally divides the periphery of the cylindrical member into eight sections, a third step of attaching a ring-like member made of an insulating material to each of end surfaces of the cylindrical member which are opposed to each other in the direction of axis of the cylindrical member in such a way that bottom portions of the grooves are exposed, and a fourth step of dividing the cylindrical member into eight electrodes by extending the bottom portions of the grooves in the direction of radius of the cylindrical member to reach the hole of the cylindrical member with the ring-like members attached. The dimensional precision of the electrostatic deflecting electrode is determined by the precision of the cylindrical member. Thus, the deflecting electrode unit is easy to process and assemble with precision.

14 Claims, 8 Drawing Sheets

ELECTROSTATIC DEFLECTING
ELECTRODE UNIT FOR USE IN CHARGED
BEAM LITHOGRAPHY APPARATUS AND
METHOD OF MANUFACTURE THE SAME

BACKGROUND OF THE INVENTION

The present invention relates to an electrostatic deflecting electrode unit for use in a charged beam lithography apparatus and a method of manufacture the same.

This application is based on Japanese Patent Application No. 9-64935, filed Mar. 18, 1997, the content of which is incorporated herein by reference.

As is well known, in the process of manufacturing semiconductor devices lithography techniques are used to transfer a mask pattern drawn on a mask made of quartz to a wafer. In general, a charged beam lithography apparatus is used to form a mask pattern on a mask. In the charged beam lithography apparatus, a beam of electrons emitted from an electron gun is shaped into a sharp narrow beam having a desired shape in vacuum atmosphere and the shaped electron beam is then irradiated and deflected repetitively in accordance with pattern data to form a pattern on the mask.

Recently, the pattern density of semiconductor devices has increased rapidly and correspondingly the critical dimension of mask patterns used in lithography has also been further scaled down. In order to form a very small pattern in as short a time as possible, therefore, the lithography apparatus must conform to high throughput and high accuracy requirements.

The lithography apparatus is usually equipped with an in-lens electrostatic deflecting electrode unit that is built into an electric optical lens. There is a need to scale down the dimensions of the deflecting electrode unit. In addition, in order to obtain desired deflection sensitivity and electric optical characteristics, high-precision parts processing is required.

When used for a long time, the surface of the electrostatic deflecting electrode is contaminated due to scattering of a phosensitive resist applied to a mask for drawing a pattern thereon. When a nonconductive contaminant such as a photosensitive resist is attached to the surface of the electrostatic deflecting electrode, charged-up which is a cause of electron beam drift is caused, thus making it impossible to maintain desired patterning precision. In such a case, the electrostatic deflecting electrode unit needs to be replaced with a new one. Therefore, there is a demand for development of a method of manufacturing electrostatic deflecting electrode unit of the same dimension and the same performance efficiently with precision. This is for the purpose of preventing the patterning precision from reducing because of deflecting electrode unit replacement.

Referring now to FIG. 1, there is illustrated a schematic of an electron beam lithography apparatus which is one of conventional charged beam lithography apparatuses.

An electron beam 2, which is a charged beam, produced by an electron gun 1 passes through a condenser lens 3, a first shaping aperture 4, and a projection lens 5 in sequence and then passes through a second shaping aperture 6, whereby it is shaped in cross-section. The shaped electron beam projected through an objective lens 8 for reducing the beam size onto a substrate 9 which is maintained at ground potential.

The projection lens 5 consists of two lens elements. The projection lens 5 has a shaping deflecting electrode unit 10 placed inside its lens elements, while the objective lens 8 has an objective deflecting electrode unit 11 placed inside thereof. The deflecting electrode units 10 and 11 have deflecting electrodes 12a through 12h and 13a through 13h, respectively. In the arrangement of these deflecting electrodes, a pair of electrodes which face each other is used as a base unit, and N (N is an integer of 2 or more) pairs of such electrodes are placed around a center axis. A driving voltage is applied between the electrodes in each pair, so that electric fields are generated in the space surrounded with the electrodes.

The electron beam 2 passes through the electric fields, then is projected onto the substrate 9. The electron beam 2 can therefore be deflected by changing the driving voltage between the paired electrodes of the two vertically placed sets of the deflecting electrodes 12a through 12h and 13a through 13h. By changing each driving voltage, the amount of deflection can be controlled to draw a desired pattern 14 on the substrate 9.

In order to improve the accuracy of the pattern 14, it is required to improve the accuracy of the deflection of the electron beam 2. To this end, it is required to make the electric fields in the spaces surrounded with the deflecting electrodes uniform so as to prevent some variation in the electronic beam position from affecting the angle of deflection of the electron beam.

One of methods that meet such requirements is to make the spacing between the faced deflecting electrodes in each pair large and confirm whether the deflecting electrodes are precisely manufactured. When the spacing between the faced deflecting electrodes is set large, however, it is required to apply a high driving voltage between the paired deflecting electrodes in order to achieve electric field strength necessary to deflect the electron beam by a predetermined amount. In general, a deflection amplifier that generates the driving voltage has a drawback that its response speed decreases with increasing output voltage. With this method, therefore, at present it is difficult to make fast response and high precision stand together.

On the other hand, another method has also been conceived which prevents the response speed of the deflection amplifier from lowering in order to achieve fast response by making the spacing between the deflecting electrodes small and thereby allowing the driving voltage to be low. A still another method has also been conceived which achieves high-precision resolution by subdividing each deflecting electrode to increase the number of the deflecting electrodes and setting the driving voltage for each electrode pair finely to generate a uniform electric field.

According to the above two methods, however, since the dimensions of individual parts are scaled down, the dimensional precision of each deflecting electrode must be increased accordingly. However, it is difficult to increase the dimensional precision. There is another drawback that a deflection distortion of the electron beam 2 is increased due to a decrease in assembly precision.

On the other hand, there is known an example of a deflecting electrode unit which removes the above-described drawback by improving the precision of the subdivided small deflecting electrodes. This type of deflecting electrode unit is shown in FIG. 2.

With this deflecting electrode unit, each of eight T-shaped electrodes 20 is attached to a respective one of insulating members 21 machined so that their thickness becomes uniform and then removably fixed with screws to a deflecting electrode holder 22 of octangle prism-machined with precision with an NC machine. At the time of assembly, after the insulating member 21 is coupled to the upper portion of the T-shaped electrode 20 with screws, a determination is made as to whether or not the surface of the T-shaped electrode 20 that faces the holder 22, the surface 21a of the insulating member 21 that is to be attached to the holder 22 and the opposite surface 21b each have desired dimensional precision, flatness, and parallelism. After the desired precision has been confirmed, the insulating member 21 attached with the T-shaped electrode 20 is secured to the holder 22 with reference to the end surface of the insulating member and the abutting portion (not shown) of the holder 22.

Since the surface of the insulating member 21 for insulatingly separating the electrodes is manufactured with high precision, the precision of the deflecting electrode unit can be theoretically maintained at high level if there is no error in manufacturing process.

Further, there are other conventional deflecting electrode manufacturing methods described in Japanese Patent Disclosures Nos. 2-123651 and 5-29201 and an easy-to-manufacture deflecting electrode described in Japanese Patent Disclosure No. 5-129193.

With the conventional deflecting electrodes for use in charged beam lithography apparatus including an apparatus shown in FIG. 2, the positional precision of the electrode surfaces cannot be confirmed after assembly. Therefore, the precision in the assembly of each part is required stringently (particularly the precision in the attachment of the insulating member 21 to the holder member 22) and moreover parts must be selected so as to minimize variations during assembly. Considerable labor will be involved in evaluating the precision of parts and selecting good parts.

In the manufacturing method described in Japanese Patent Disclosure No. 2-123651, conductive silicon carbide SiC of hollow symmetric form finished as a cylindrical part having a roundness of the order of some tens of microns by lathe machining after baking and an insulating material, such as alumina-based ceramic, of hollow symmetric form which is patterned with wiring are made integral with each other by fitting an end portion of one into the other. Then, grooves are formed in the silicon carbide, serving as an electrode member, to the depth to reach the alumina-based ceramic at the fitted portion, thereby dividing the silicon carbide into a predetermined number of pieces. Thus, high-precision deflecting electrode unit is obtained.

With this method, however, since one end of the electrodes is fitted into the insulating material, there is the possibility that the positional precision of each electrode cannot be maintained after the electrode member has been cut. Additionally, it is difficult for the deflecting electrode unit with an assembly accuracy on the order of some tens of microns resulting from the fitting structure to satisfy electron beam positional precision requirements for patterning on submicron levels as in recent years because of its too large deflection abbreviation.

In the manufacturing method described in Japanese Patent Disclosure No. 5-29201, a cylindrical block made of metal is formed with a central hole through which an electron beam will pass, then a plurality of inter grooves are formed radially in its inside surface and an equal number of outer grooves are formed radially in the outside surface. After that, an insulator is inserted into each of the outer grooves and then glued to the metal. Subsequent to gluing, each inter groove is further cut to eventually connect with the corresponding outer groove, thereby forming a deflecting electrode unit.

In this method, subsequent to gluing, baking is performed after cleaning to remove chips formed in joining the inter and outer grooves and oil. In baking, there is the possibility that desired precision may not be obtained due to thermal deformation resulting from the difference in thermal expansion between the electrode made of metal and the insulator serving as glue.

The deflecting electrode unit disclosed in Japanese Patent Disclosure No. 5-129193 has a structure such that each of deflecting electrodes is secured with screws to the internal surface of a tube-like insulator made of ceramics. That is, electrodes in the form of cylinder having the same diameter as the inside diameter of the tube-like insulator are fitted into the insulator and then a hole is bored in the center of the electrode along the height of the cylinder. Positioning-pin holes and threaded holes are then formed from the outside of the insulator. The electrode and the insulator are fixed in position with positioning pins and screws. The hole of the electrode is polished inside so that its cross-sectional shape becomes a circle of a predetermined size. Subsequent to polishing, the electrode is split by means of electric discharge machining to obtain electrically isolated electrodes. After that, each deflecting electrode is taken off the insulator. The surface of each electrode subjected to electric discharge machining is finished by polishing. After polishing, each electrode is positioned by the positioning pin and then secured to the insulator with screws as it was prior to disassembly.

However, in the case where the cylindrical metal is fitted into the tube-like insulator member and then attached removably to the insulator with screws, the fitting may become loosened at the time of splitting the electrode member, or looseness may occur between the insulator and the electrode because of expansion due to heat generated at the time of machining and subsequent contraction. In such a case, retightening of screws may be required after the splitting of the electrode, and the electrodes may not be assembled with precision.

As described above, various electrostatic deflecting electrode units for use in the charged beam lithography system have been proposed heretofore. However, every deflecting electrode unit, while having advantages, is difficult to assemble with high dimensional precision.

BRIEF SUMMARY OF THE INVENTION

Accordingly, it is an object of the present invention to provide an electrostatic deflecting electrode unit for use in a charged beam lithography apparatus in which electrodes are easy to assemble with high positional precision and a method of manufacture the same.

According to the present invention, there is provided a method of manufacturing an electrostatic deflecting electrode unit, for use in charged beam lithography apparatus, in which a pair of electrodes opposed to each other is used as a base unit and N (an integer of two or more) number of such electrode pairs are placed around a center axis, comprising the steps of forming grooves of a predetermined width in a cylindrical member made of a metal and bored with a center hole in the direction of radius thereof along lines that equally divides the periphery of the cylindrical member into 2N sections, attaching a ring-like member made of an insulating material to each of end surfaces of the cylindrical member which are opposed to each other in the direction of axis of the cylindrical member, and dividing the cylindrical member into 2N electrodes by extending the bottom portions of the grooves in the direction of radius of the cylindrical member to reach the hole of the cylindrical member with the ring-like members attached.

According to the present invention, there is provided another method of manufacturing an electrostatic deflecting electrode, for use in charged beam lithography apparatus, in which a pair of electrodes opposed to each other is used as a base unit and N (an integer of two or more) number of such electrode pairs are placed around a center axis, comprising the steps of forming grooves of a predetermined width in a cylindrical member made of a metal, bored with a center hole and coated with a conductive oxide film in the direction of radius thereof and along lines that equally divides the periphery of the cylindrical member into 2N sections; attaching a ring-like member made of an insulating material to each of end surfaces of the cylindrical member which are opposed to each other in the direction of axis of the cylindrical member; and dividing the cylindrical member into 2N electrodes by extending the bottom portions of the grooves in the direction of radius of the cylindrical member to reach the hole of the cylindrical member with the ring-like members attached.

According to the present invention, there is provided a still another method of manufacturing an electrostatic deflecting electrode, for use in charged beam lithography apparatus, in which a pair of electrodes opposed to each other is used as a base unit and N (an integer of two or more) number of such electrode pairs are placed around a center axis, comprising the steps of forming grooves of a predetermined width in a cylindrical member made of a metal, bored with a center hole and coated with a nonconductive oxide film in the direction of radius thereof and along lines that equally divides the periphery of the cylindrical member into 2N sections, the cylindrical member having small-in-diameter portions in its end portions and a large-in-diameter portion in its central portion; attaching a first ring-like member to each of end surfaces of the large-in-diameter portion of cylindrical member which are opposed to each other in the direction of axis of the cylindrical member; dividing the cylindrical member into 2N electrodes by extending the bottom portions of the grooves in the direction of radius of the cylindrical member to reach the hole of the cylindrical member with the first ring-like members attached, cleaning the 2n electrodes with the first ring-like members attached; attaching second ring-like members to end surfaces of the small-in-diameter portions at both ends of the cylindrical member, then detaching the first ring-like members and cleaning the electrodes, coating exposed surfaces of each of the electrodes which are held by the second ring-like members are attached with a conductive film performing cleaning and baking at a predetermined temperature, and then performing cleaning and backing at a predetermined temperature with the first ring-like members attached after the second ring-like members are detached; and attaching third ring-like members of an insulating material to the end surfaces of the large-in-diameter portion of the cylindrical member which are opposed to each other in the direction of axis of the cylindrical member and then detaching the second ring-like members.

According to the present invention, it is easy to process and assemble an electrostatic deflecting electrode for use in charged beam lithography apparatus with high dimensional precision.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a method for manufacturing an electrostatic deflecting electrode unit for a charged beam lithography apparatus according to the present invention will now be described with reference to the accompanying drawings. Electrode materials used in the present invention include two: one which has a surface coated with an electrically conductive oxide film, and one which has a surface coated with an electrically nonconductive oxide film. The former is titanium or titanium alloy, while the latter is aluminum or aluminum alloy. When the latter material is used, it is required to coat its surface with an electrically conductive film in the middle of manufacture.

First Embodiment

The first embodiment uses a material of titanium or titanium alloy. FIGS. 3A, 3B, 4A and 4B show the process of manufacture of an electrostatic deflecting electrode unit according to the first embodiment of the present invention.

Figure 3A:
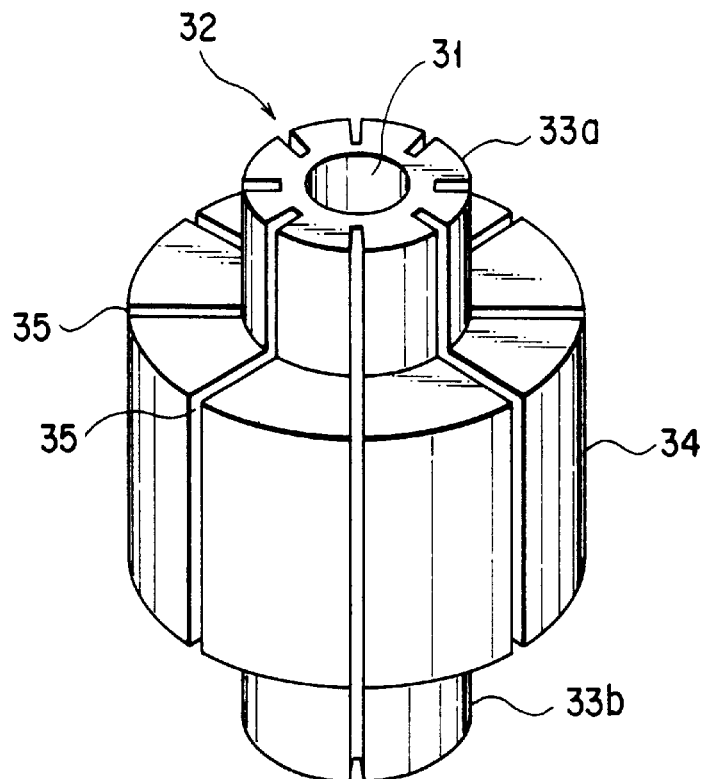
FIGS. 3A and 3B are diagrams for use in explanation of a method of manufacturing an electrostatic deflecting electrode in accordance with a first embodiment of the present invention.

At first, as shown in FIG. 3A, a cylindrical material made of titan or titan alloy and coated with a conductive oxide film is prepared and a hole 31 with high roundness is bored along the line of axis by means of grinding to form a hollow cylindrical material 32. The cylindrical material 32 are made to have in its both end portions small-in-diameter portions 33a and 33b which are smaller in diameter than the central portion 34 (large-in-diameter portion). These small-indiameter portions are also made by grinding. Thus, a first step of manufacture terminates.

Next, grooves 35 of a predetermined width are formed radially from the periphery of the large-in-diameter portion 34 into the cylindrical material 32 along lines that equally divide the periphery of the material into 2N (in this example, N=4; this is intended to provide four pairs of electrodes). The grooves are formed in both the large-in-diameter portion 34 and the small-in-diameter portions 33a and 33b at the depth that does not reach the hole 31 in the small-in-diameter portions 33a and 33b. The wire-cutting electric discharge machining is specially adapted to form the grooves.

Figure 3B:
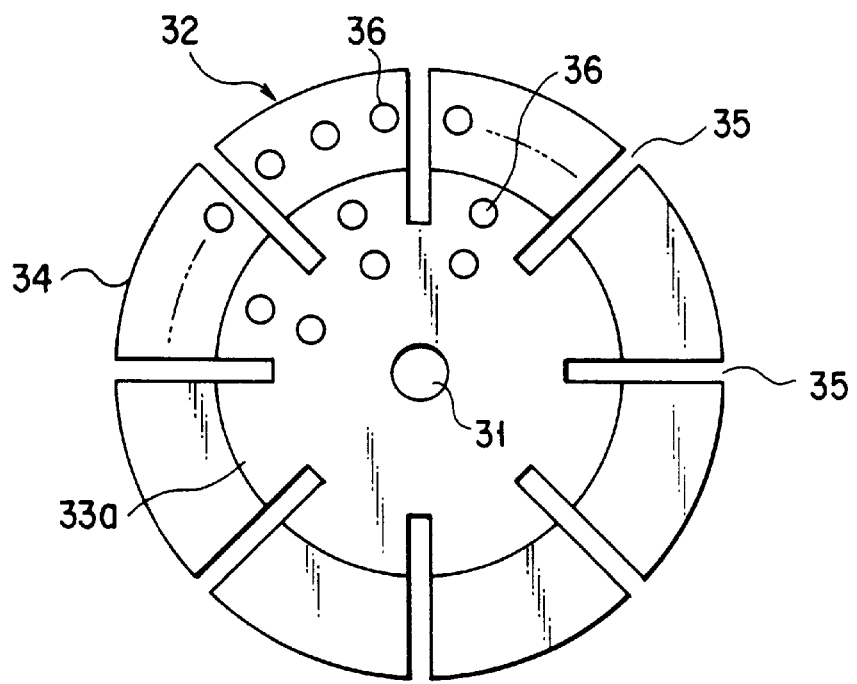

Next, as shown in FIG. 3B, threaded holes 36 are formed coaxially at regularly spaced intervals in the end surfaces of the cylindrical material 32 (the end surface of each small-in-diameter portions 33a and 33b and the end surfaces of the large-in-diameter portion 34). The holes 36 are formed not to locate on lines that connect the grooves 35 and the center of the hole 31. Thus, a second step of the process terminates.

Figure 4A:
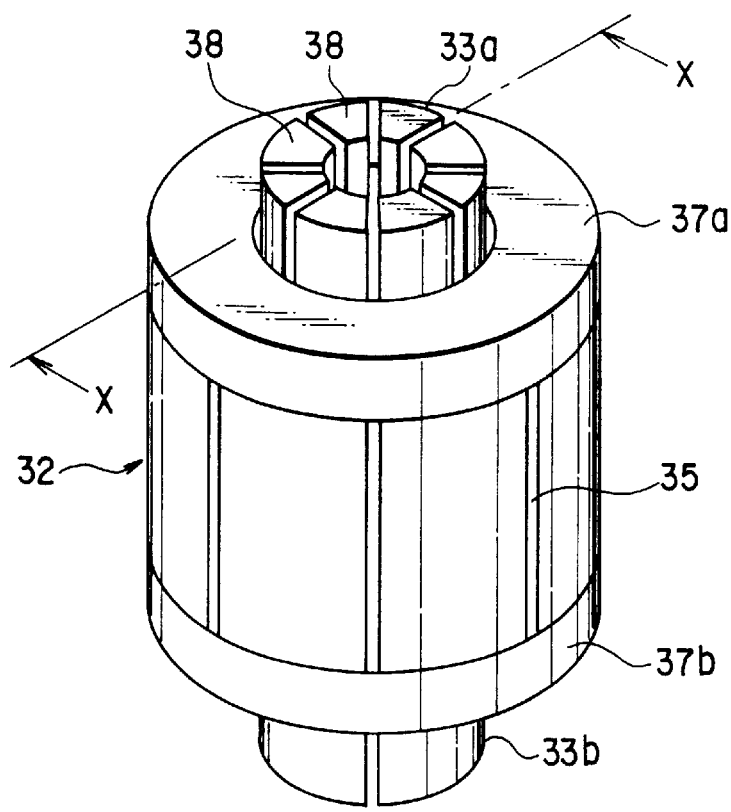
FIG. 4A is a perspective view of the electrostatic deflecting electrode in accordance with the first embodiment of the invention.
Figure 4B:
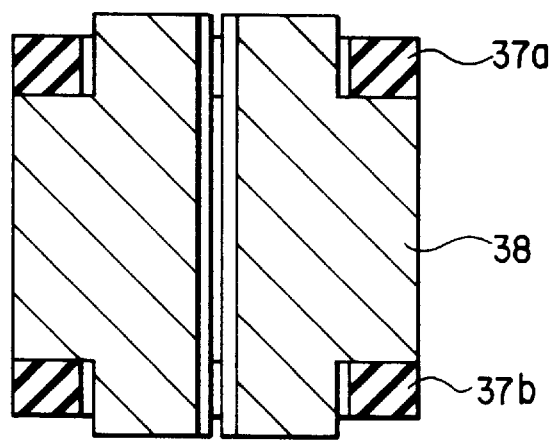
FIG. 4B is a longitudinal sectional view of the electrostatic deflecting electrode taken along the line X—X of FIG. 4A.

Next, as shown in FIGS. 4A and 4B, ring-like jigs 37a and 37b are applied to the end surfaces of the cylindrical material 32 (the end surfaces of the small-in-diameter portions 33a and 33b or the end surfaces of the large-in-diameter portion 34), in this example, to the end surfaces of the large-in-diameter portion 34. The jigs 37a and 37b are made of an insulating material such as alumina ceramics, quartz, glass with low thermal expansion coefficient, or the like. The jigs 37a and 37b are formed with holes (not shown) each of which aligns with a respective one of the threaded holes 36. The ring-like jigs 37a and 37b are attached to the cylindrical material 32 with male screws. Thus, a third step of the process is terminated.

Next, with the ring-like jigs 37a and 37b attached, each of the grooves 35 in the small-in-diameter portions 33a and 33b protruding from the jigs 37a and 37b is cut deeper to eventually reach the hole 31, thereby separating the cylindrical material into 2N pieces of electrodes, in this example, eight electrodes. The wire-cutting electric discharge machining is adapted to cut the grooves deeper. Thus, a fourth step of the process is terminated.

At the termination of the fourth step, eight electrodes 38 are supported mechanically by the ring-like jigs 37a and 37b and simultaneously they are held electrically isolated from one another.

Thus, according to the deflecting electrode assembly of this example, the cylindrical material 32 is separated into 2N electrodes with the flat ring-like jigs 37a and 37b fixed to the flat end surfaces of the cylinder 32. Thus, the positional relationship among the electrodes remains unchanged from that before they are separated. The jigs 37a and 37b are fixed to the cylindrical material 32 by means of screws. Since the threaded holes 36 are spaced at regular intervals and the contact surfaces are flat, the unevenness of tightening the screws will little affect the assembly precision. The dimensional precision of the electrostatic deflecting electrodes (the positional precision of the space defined by the tip ends of the electrodes) is determined by the dimensional precision of the cylindrical material 33 (the center hole 31, in particular). It is normally easy to make the cylindrical material with precision even with widely used machines. It therefore becomes possible to make the electrostatic deflecting electrodes with precision in a short time.

Second Embodiment

Figure 5:
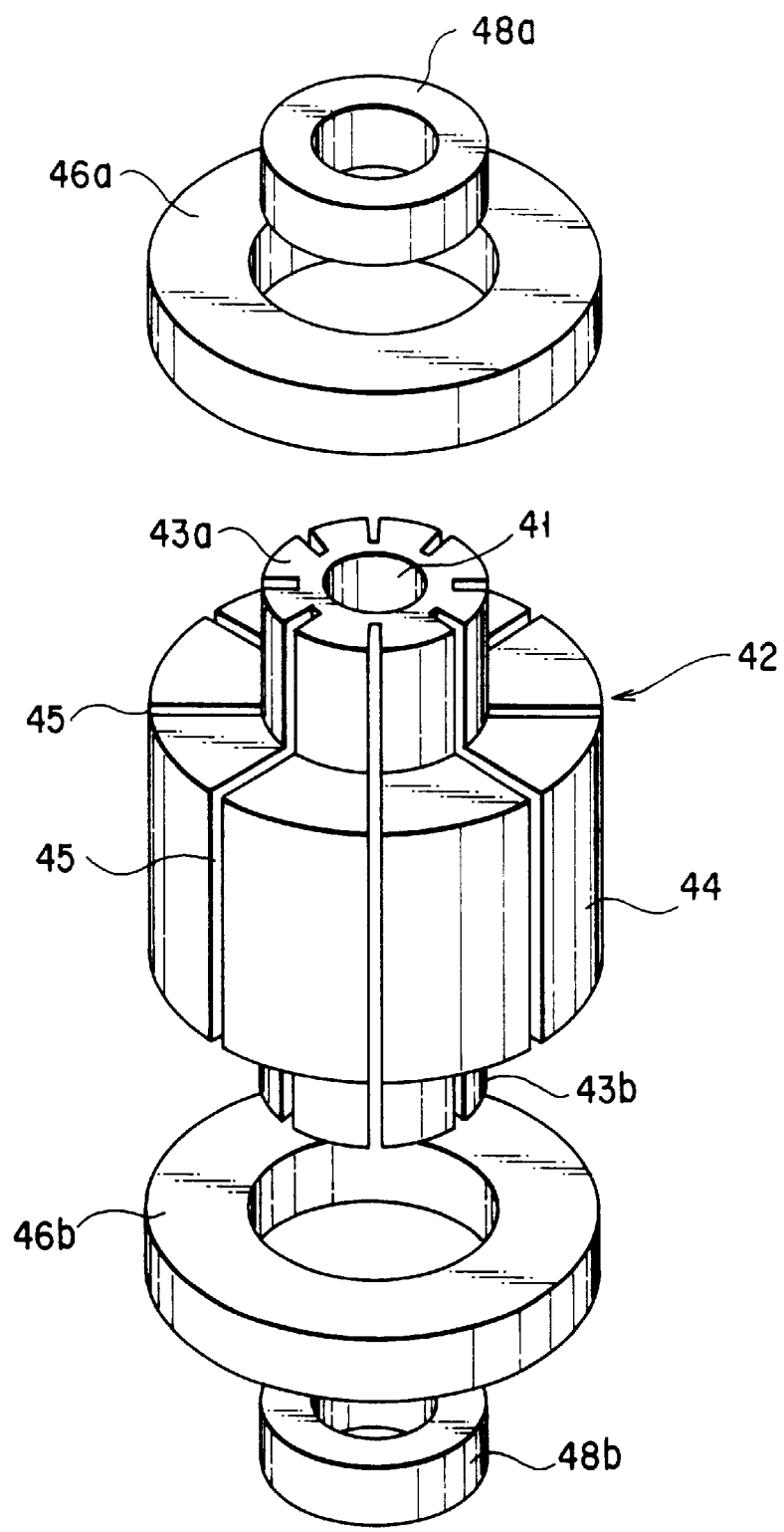
FIGS. 5, 6 and 7 are diagrams for use in explanation of a method of manufacturing an electrostatic deflecting electrode in accordance with a second embodiment of the present invention.
Figure 6:
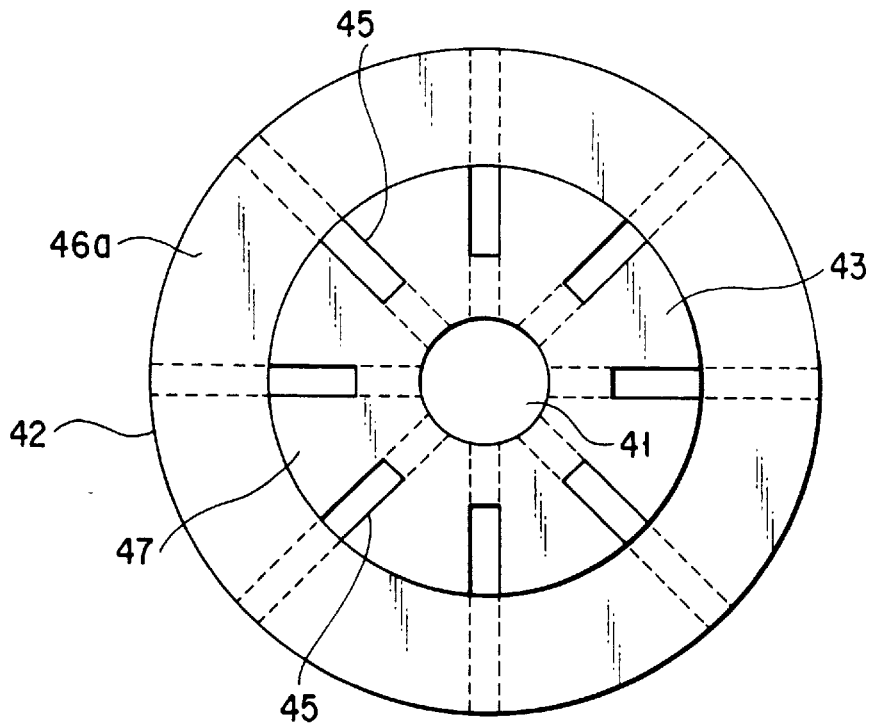
Figure 7:
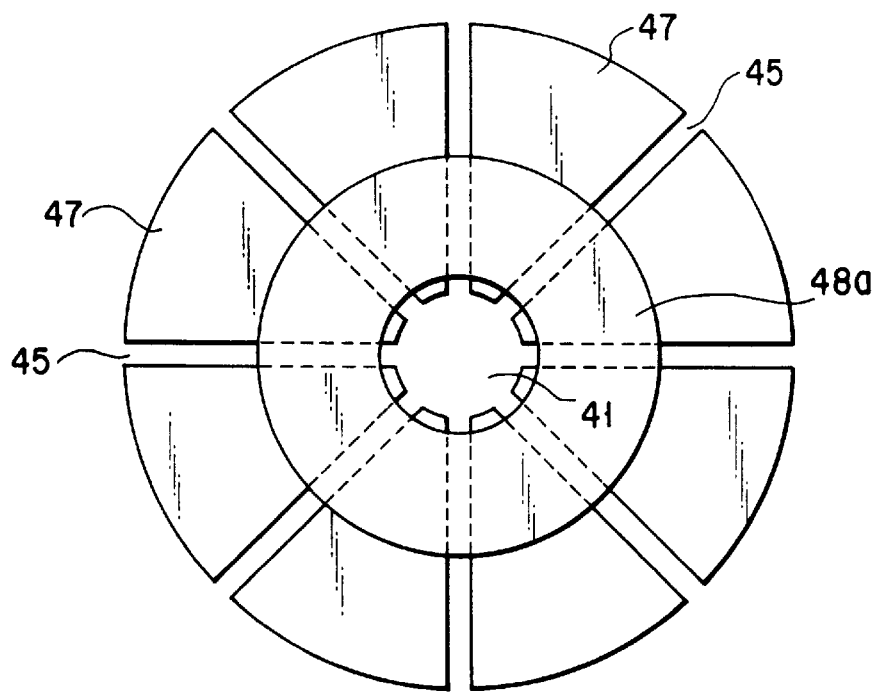

FIGS. 5 through 7 illustrate a method of manufacturing an electrostatic deflecting electrode unit according to a second embodiment of the present invention. The second embodiment is directed to manufacture of an electrostatic deflecting electrode unit using a material which is good in processability but coated with non-conductive oxide film. To use such a material for electrodes, it is required to coat with a conductive film after processing because charge-up may occur.

First, as shown in FIG. 5, a cylindrical material made of aluminum or aluminum alloy and coated with a non-conductive film is prepared and a hole 41 with high roundness is bored along the line of axis by means of grinding to form a hollow cylindrical material 42. The cylindrical material 42 has its both end portions 43a and 43b made to be smaller in diameter than its central portion 44 (large-in-diameter portion). These small-in-diameter portions 43a and 43b are also made by grinding. Thus, a first step of manufacture terminates.

Next, grooves 45 of a predetermined width are formed radially from the periphery of the large-in-diameter portion 44 into the cylindrical material 42 along lines that equally partition the periphery of the material into 2N (in this example, N=4; this is intended to provide four pairs of electrodes). The grooves 45 are formed in both the large-in-diameter portion 44 and the small-in-diameter portions 43a and 43b at the depth that does not reach the hole 41 in the small-in-diameter portions 43a and 43b. The wire-cutting electric discharge machining is specially adapted to form the grooves 45.

Next, threaded holes (not shown here) are formed coaxially at regularly spaced intervals in the end surfaces of the cylindrical material 42 (the end surfaces of small-in-diameter portions 43a and 43b and the end surface of the large-in-diameter portion 44) as in the previous embodiment. The holes are formed not to locate on lines that connect the grooves 45 and the center of the hole 41. Thus, a second step of the process terminates. The steps described so far are exactly the same as those in the previous embodiment.

Next, as shown in FIG. 6, first ring-like jigs 46a and 46b are applied to the end surfaces of the cylindrical material 42 (the end surfaces of the small-in-diameter portions 43a and 43b or the end surfaces of the large-in-diameter portion 44), in this example, to the end surfaces of the large-in-diameter portion 44. The jigs 46a and 46b are made of a material which is identical to the cylindrical material 42 or is substantially equal in thermal expansion coefficient to the material 42. As in the first embodiment, the jigs 46a and 46b are formed with holes (not shown) each of which aligns with a respective one of the threaded holes formed at the end surfaces of the large-in-diameter portion 44. The ring-like jigs 46a and 46b are secured to the cylindrical material 42 with male screws. Thus, a third step of the process is terminated.

Next, with the ring-like jigs 46a and 46b secured, each of the grooves 35 in the small-in-diameter portions 43a and 43b protruding from the jigs 46a and 46b is cut deeper to eventually reach the hole 41 to thereby separate the cylindrical material into 2N pieces of electrodes 47, in this example, eight electrodes. The wire-cutting electric discharge machining is adapted to cut the grooves 45 deeper. Thus, a fourth step of the process is terminated.

Although, in the first embodiment, the fourth step is the final step, the second embodiment requires a further step of forming a conductive film on the surface of the material because the material is good in processability but coated with a non-conductive film and, when used as it is, may cause charge-up. First, as pretreatment, the surface of each of the 2N electrodes is cleaned with pure water or the like to take out oil used for electric discharge machining and soiling produced during the machining. The cleaning may be omitted when the oil and soiling are considered to be non-existent.

Next, as shown in FIG. 7, second ring-like jigs 48a and 48b are applied to the end surfaces of the small-in-diameter portions 43a and 43b. The jigs 48a and 48b are made of a material which is identical to the cylindrical material 42 or is substantially equal in thermal expansion coefficient to the material 42. The jigs 48a and 48b are formed with holes (not shown) each of which aligns with a respective one of the threaded holes formed at the end surfaces of the small-in-diameter portion 43a and 43b. The ring-like jigs 48a and 48b are then fixed to the cylindrical material 42 with male screws.

Next, the first ring-like jigs 46a and 46b are detached. Even if the first jigs 46a and 46b are detached, the eight electrodes 47 are locked and positioned relative to one another by the second jigs 48a and 48b. In this state, each electrode 47 is cleaned again to take out oil and soiling.

Next, the surface of each electrode 47 is coated with conductive film. If, for example, the cylindrical material 42 is made of aluminum alloy, the electrode 47 is coated with phosphoreted nickel alloy by means of, for example, plating and then plated with, for example, gold for providing good adhesion. After that, cleaning is performed to remove plating solution. The first jigs 46a and 46b are attached again and the second jigs 48a and 48b are detached. Cleaning is performed again to remove the plating solution. After that, baking is carried out for degasification. When the conductive film is the gold plated film, it is required to maintain the temperature within the vacuum furnace at 200° C. or below in order to prevent nickel having magnetism from diffusing into the surface of the gold plated film. The second jigs 48a and 48b are made of the same material as the electrodes 47 or a material which is substantially equal in thermal expansion coefficient to the electrodes 47. Hence, the second jigs 48a and 48b and the electrodes 47 become equal in the amount of deformation attendant thermal expansion, keeping the dimensional precision of the eight electrodes 47. Thus, a sixth step terminates.

Next, the first jigs 46a and 46b are detached after the second jigs 48a and 48b have been attached. Then, third ring-like jigs (not shown) are secured to the end faces of the cylindrical material to which the first jigs 46a and 46b were fixed. The third jigs are made of a material, such as alumina ceramics, quartz glass, glass with low thermal expansion coefficient, polyimide, or the like, that has insulation, has little degasification in vacuum, and is little subject to secular change. That is, the third jigs are made of the same material with the same shape as the ring-like jigs 37a and 37b used in the first embodiment. Finally, the second jigs 48a and 48b are detached, completing the electrostatic deflecting electrode unit. In this manner, a seventh step terminates.

At the termination of the seventh step, the deflecting electrodes 47 are supported by the third jigs each consisting of an insulator in such a way that they are electrically isolated. The shape of the entire electrodes remains unchanged from that in the first embodiment shown in FIGS. 4A and 4B.

As described above, as with the first embodiment, the manufacturing method of the second embodiment allows an electrostatic deflecting electrode unit with high positional precision to be manufactured in a short time. Additionally, since the electrodes are made of a material, such as aluminum or aluminum alloy, that is good in processability, the deflecting electrode unit is easier to manufacture.

Third Embodiment

Figure 8:
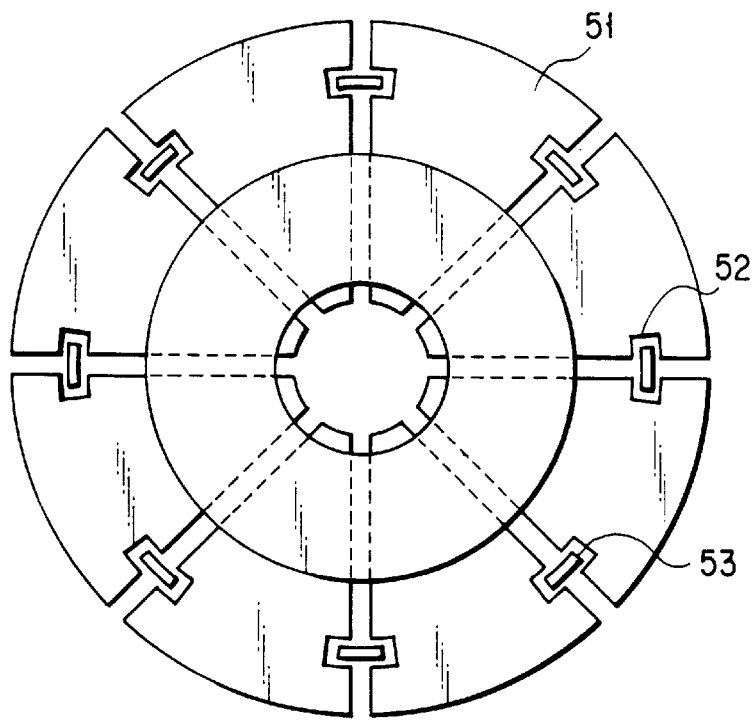
FIG. 8 is a schematic of an electrostatic deflecting electrode in accordance with a third embodiment of the present invention.

FIG. 8 shows a third embodiment of the present invention, which is a modification of the first and second embodiments. In this embodiment, each electrode 51 is formed with grooves 52 extending in parallel with the axis and the grooves of the adjacent electrodes are opposed to each other so that a space is created therebetween. A metal plate 53 is placed in the space between each electrode so that it will not contact the electrodes. Even if the third jigs that lock each electrode in place are charged up by scattered electrons, therefore, a beam of electrons will not be affected thereby.

Fourth Embodiment

Figure 9:
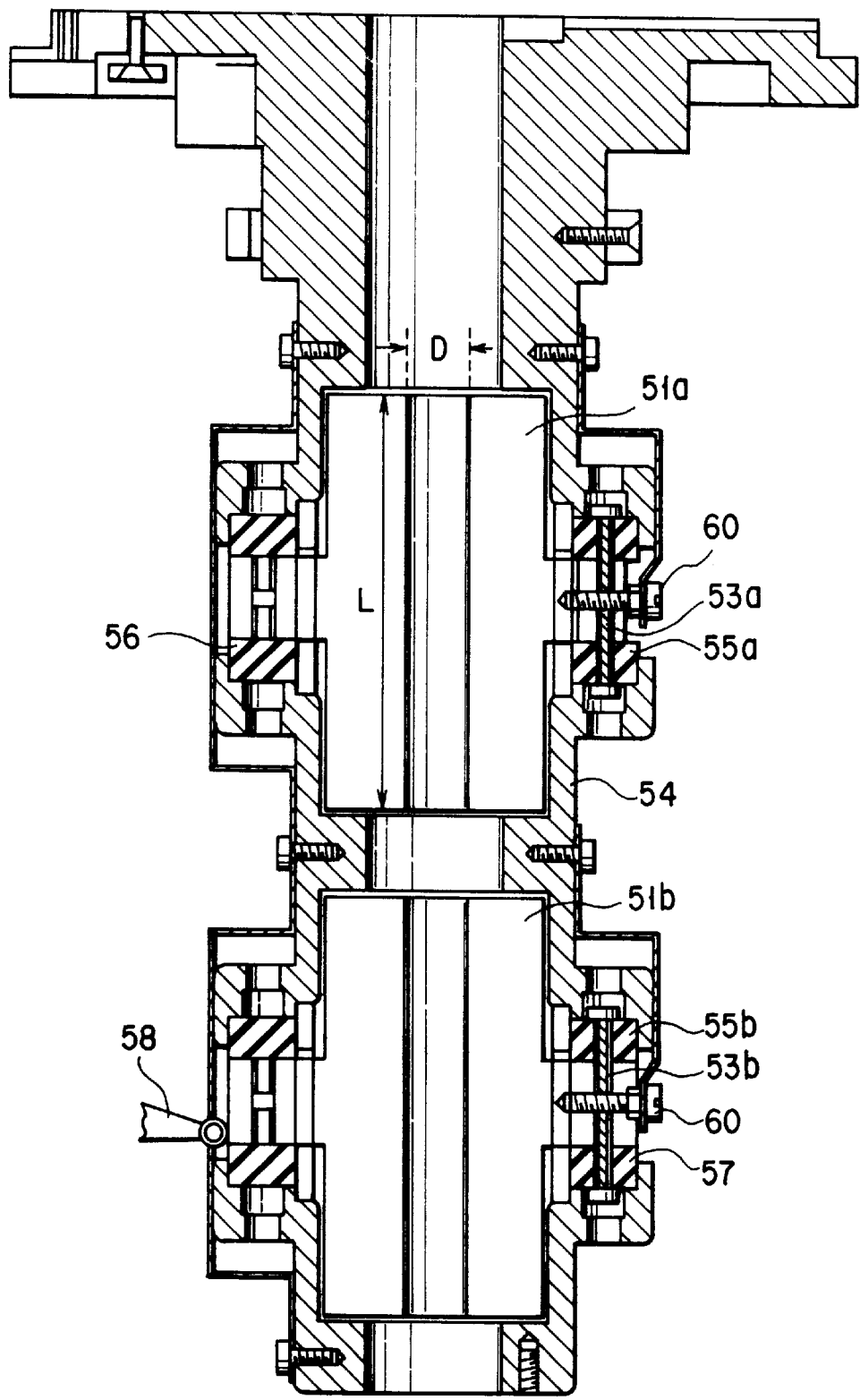
FIG. 9 shows an electrostatic deflecting electrode units for electron beam lithography apparatus in accordance with a fourth embodiment of the present invention.

Next, a description will be given of an example in which the electrostatic deflecting electrode units of the first to third embodiments described above are actually incorporated into a charged beam lithography apparatus. FIG. 9 shows a deflector of a charged beam lithography apparatus into which the deflecting electrode units of the third embodiment are incorporated.

In each of first and second electrostatic deflecting electrode units 51a and 51b manufactured in accordance with the method described previously, the length L of each electrode unit along the axis and the inside diameter D of the cylinder divided into eight electrodes are determined in accordance with deflection sensitivity required to deflect an electron beam.

Figure 1:
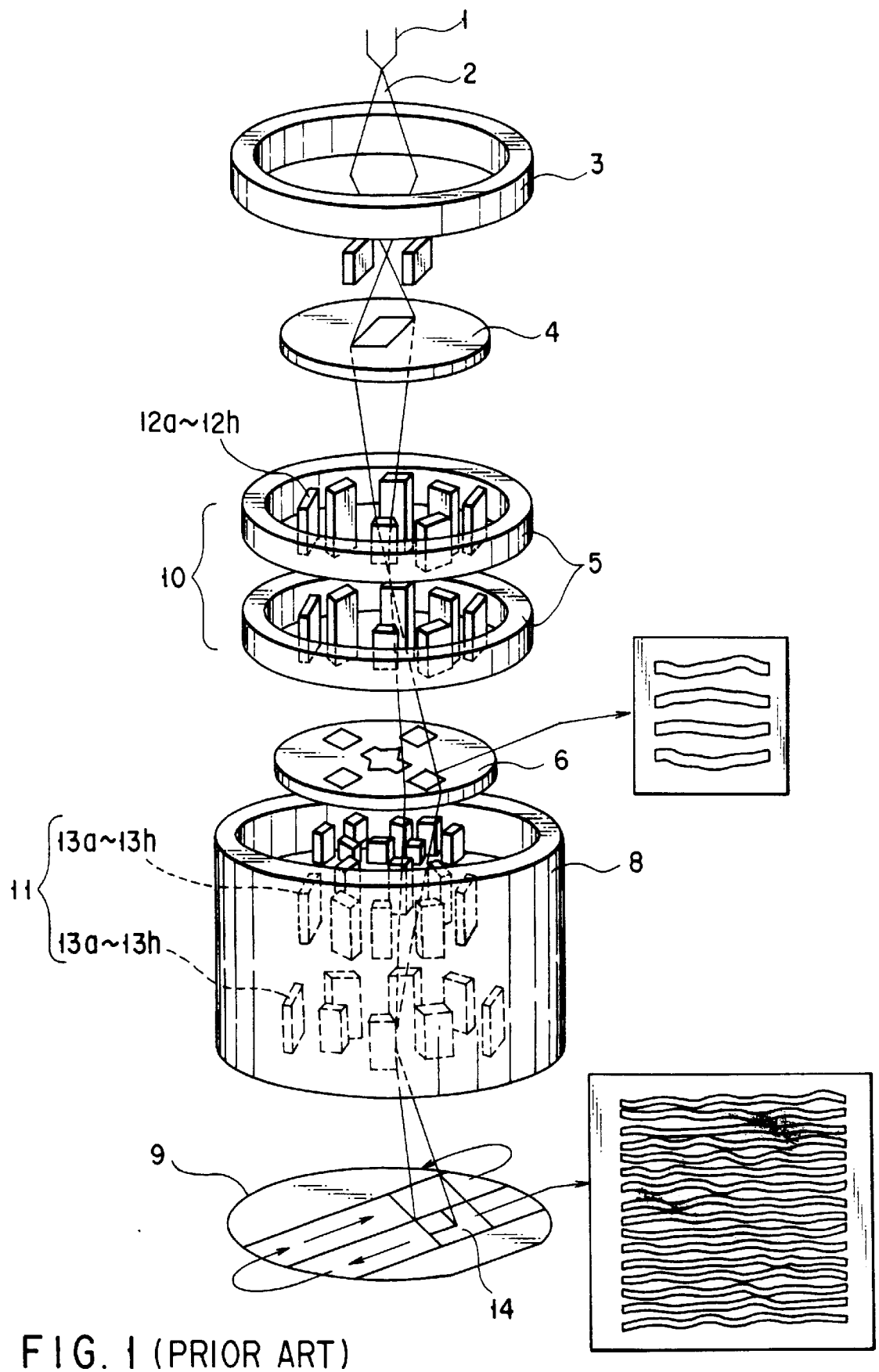
FIG. 1 is a schematic of a standard charged beam lithography apparatus.
Figure 2:
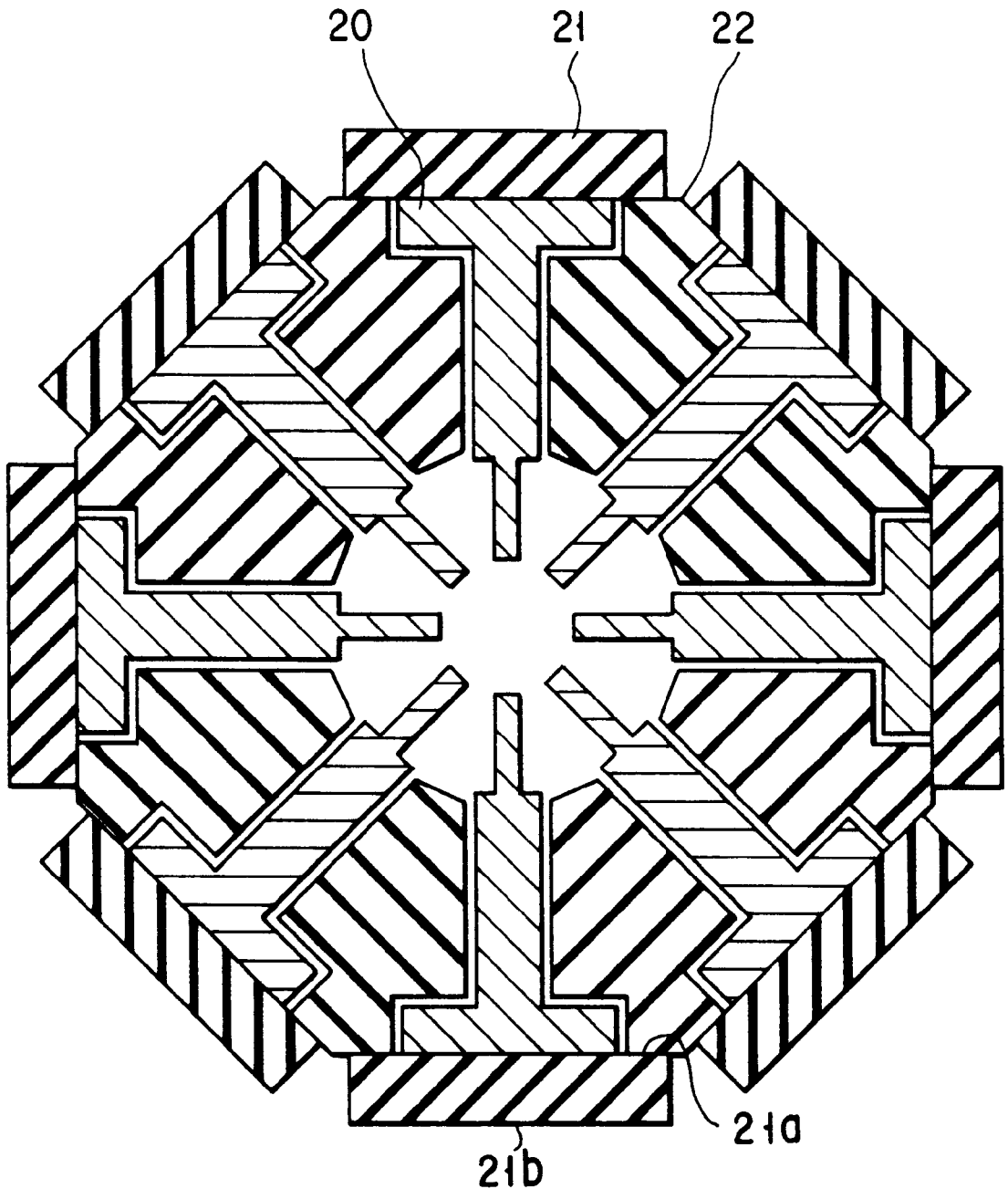
FIG. 2 shows a typical example of a conventional electrostatic deflecting electrode used in a charged beam lithography apparatus.

A cylindrical metal member 54, having an inside diameter of about twice the inside diameter D of the electrode cylinder, is placed between the first and second deflecting electrode units 51a and 51b and then attached to the ring-like jigs 55a and 55b of the respective deflecting electrode unit 51a and 51b with screws (not shown). The metal member 54 is made of aluminum coated with a conductive film such as gold, titanium alloy coated with a conductive oxide film, or conductive ceramics, such as silicon carbide. The metal member 54 is fixed to each of the first and second deflecting electrode units 51a and 51b by means of screws through washers made of an insulating material, such as polycarbonate, alumina ceramics, or the like. Therefore, even if the screws are made of the same material as the deflecting electrodes, the metal member 54 and the first and second deflecting electrode units 51a and 51b are electrically insulated from each other. The metal plate 53 placed in each space between the adjacent electrodes 51 as shown in FIG. 8 is grounded through a screw 60. The deflector shown in FIG. 9 is placed in the electrostatic lens portion of the lithography apparatus as shown in FIG. 1.

For the first and second electrostatic deflecting electrode units 51a and 51b thus incorporated into the lithography apparatus, the roundness of outer edge portions 56 and 57 of the respective deflecting electrode units each divided into eight pieces is measured using a roundness measurement instrument not shown.

In the roundness measurement instrument, while a measuring object is being rotated with a probe 58 brought into contact with it, the roundness of the object is measured with reference to the accuracy of rotation of the stage in the instrument.

Figure 10A:
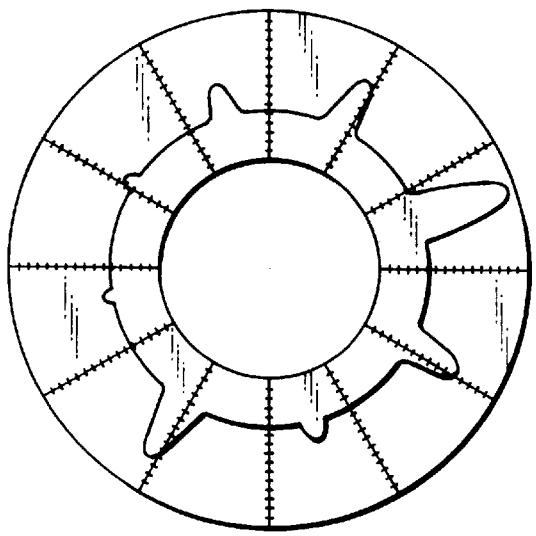
FIGS. 10A and 10B show measurements of roundness of the periphery of an electrostatic deflecting electrode unit after assembly.
Figure 10B:
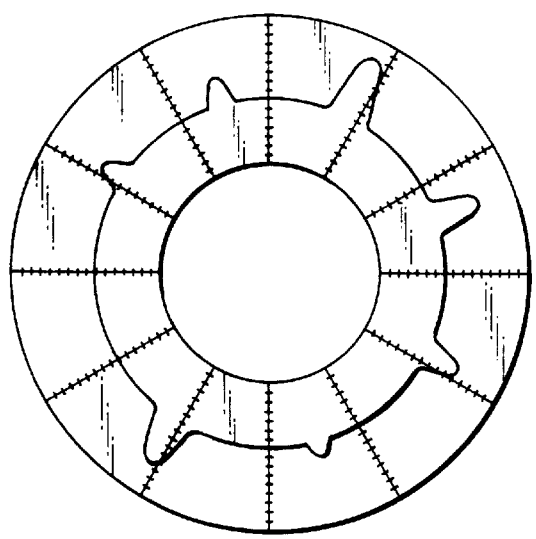

When the contour of the first electrostatic deflecting electrode unit 51a is measured in the manner mentioned above, such a result as shown in FIG. 10A is obtained. For the second deflecting electrode unit 51b, such a measurement as shown in FIG. 10B is obtained. These results show that the roundness of the outer edge portion of each deflecting electrode unit is sufficient.

In the manufacturing methods according to the present invention, the overall dimensional precision is determined by the dimensional precision of the cylindrical material. It is easy to make the dimensional precision of the cylindrical material sufficiently high. Therefore, such a very simple approach of bringing the probe 58 into contact with the outer edge portion of each deflecting electrode unit permits the roundness of the beam path inside the deflecting electrode unit to be measured easily.

Therefore, misalignment between the center of the first deflecting electrode unit and the center of the second deflecting electrode unit and the relative displacement of the first and second deflecting electrode units about the electron beam path can be minimized by reperforming the attachment of each deflecting electrode unit on the basis of such roundness measurements.

According to the present invention, as described above, a method of manufacturing an electrostatic deflecting electrode unit, for use in charged beam lithography apparatus, in which a pair of electrodes opposed to each other is used as a base unit and N (an integer of two or more) number of such electrode pairs are placed around a center axis is characterized by comprising a first step of preparing a cylindrical member made of metal and bored with a round hole; a second step of forming grooves of a predetermined width and a predetermined depth in the cylindrical member in the direction of radius thereof and along lines that equally divides the periphery of the cylindrical member into 2N sections; a third step of fixing a ring-like jig made of an insulating material to each of end surfaces of the cylindrical member which are opposed to each other in the direction of axis of the cylindrical member in such a way that bottom portions of the grooves are exposed; and a fourth step of dividing the cylindrical member into 2N electrodes by extending the bottom portions of the grooves in the direction of radius of the cylindrical member to reach the hole of the cylindrical member with the ring-like jigs fixed.

Another method of manufacturing an electrostatic deflecting electrode unit, for use in charged beam lithography apparatus, in which a pair of electrodes opposed to each other is used as a base unit and N (an integer of two or more) number of such electrode pairs are placed around a center axis is characterized by comprising a first step of preparing a cylindrical member made of metal, bored with a round hole and coated with a nonconductive oxide film; a second step of forming grooves of a predetermined width and a predetermined depth in the cylindrical member in the direction of radius thereof and along lines that equally divides the periphery of the cylindrical member into 2N sections; a third step of fixing a first ring-like jig to each of end surfaces of the cylindrical member which are opposed to each other in the direction of axis of the cylindrical member in such a way that bottom portions of the grooves are exposed; a fourth step of dividing the cylindrical member into 2N electrodes by extending the bottom portions of the grooves in the direction of radius of the cylindrical member to reach the hole of the cylindrical member with the ring-like jigs clamped; a fifth step of cleaning the 2N electrodes fixed to the first ring-like jigs, then fixing second ring-like jigs to the 2N electrodes on the inside of the first ring-like jigs and cleaning the electrodes again after the first ring-like jigs have been detached; a sixth step of coating the exposed surface of each of the 2N electrodes fixed to the second ring-like jigs with a conductive film and then cleaning and baking at a predetermined temperature with the first and second ring-like jigs attached alternately; and a seventh step of fixing third insulating ring-like jigs to electrode end-surface areas to which the first ring-like jigs were once fixed and detaching the second ring-like jigs.

Accordingly, the positional relationship among the 2N electrodes is kept unchanged throughout the processing. Thus, the dimensional precision of the deflecting electrode unit manufactured in accordance with the manufacturing methods of the present invention depends on the dimensional precision of the cylindrical member used. In general, it is easy to make the cylindrical member with precision with a standard machine. Thus, an electrostatic deflecting electrode unit can be made with high dimensional precision in a short time.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, in the first embodiment the cylindrical member 32 need not be larger in diameter in its central portion than in its end portions. The cylindrical member may be made equally in diameter over its overall length. When the cylindrical member is formed to be smaller in diameter in its end portions, ring-like jigs may first be attached to the end surfaces smaller in diameter, not to the end surfaces larger in diameter as described in the embodiments. In this case, ring-like jigs are attached to the end surfaces of the small-in-diameter portions first and the other ring-like jigs are attached to the end surfaces of the large-in-diameter portion next. The deflecting electrode unit placed in the lithography apparatus may comprise a single deflecting electrode unit as opposed to two upper and lower electrode units shown in FIG. 9.

We claim:

1. A method of manufacturing an electrostatic deflecting electrode unit, for use in charged beam lithography apparatus, in which a pair of electrodes opposed to each other is used as a base unit and N (N being an integer of two or more) number of such electrode pairs are placed around a center axis, the method comprising the steps of:

forming grooves of a predetermined width in a cylindrical member made of a metal and bored with a center hole in the direction of radius thereof along lines that equally divides the periphery of the cylindrical member into 2N sections;

attaching a ring-like member made of an insulating material to end surfaces of the cylindrical member which are opposed to each other in the direction of axis of the cylindrical member; and dividing the cylindrical member into 2N electrodes by extending the bottom portions of the grooves in the direction of radius of the cylindrical member to reach the hole of the cylindrical member with the ring-like members attached.

2. The method according to claim 1, in which each of the ring-like members is attached to a corresponding end surface of the cylindrical member by turning male screws into threaded holes formed coaxially at regularly spaced intervals in the end surface through corresponding threaded holed formed in the ring-like member.

3. The method according to claim 1, in which the grooves are formed by wire-cutting electric discharge machining.

4. A method of manufacturing an electrostatic deflecting electrode unit, for use in charged beam lithography apparatus, in which a pair of electrodes opposed to each other is used as a base unit and N (N being an integer of two or more) number of such electrode pairs are placed around a center axis, the method comprising the steps of:

forming grooves of a predetermined width in a cylindrical member made of a metal, bored with a center hole and coated with a conductive oxide film in the direction of radius thereof and along lines that equally divides the periphery of the cylindrical member into 2N sections;

attaching a ring-like member made of an insulating material to end surfaces of the cylindrical member which are opposed to each other in the direction of axis of the cylindrical member; and dividing the cylindrical member into 2N electrodes by extending the bottom portions of the grooves in the direction of radius of the cylindrical member to reach the hole of the cylindrical member with the ring-like members attached.

5. The method according to claim 4, in which each of the ring-like members is attached to a corresponding end surface of the cylindrical member by turning male screws into threaded holes formed coaxially at regularly spaced intervals in the end surface through corresponding threaded holed formed in the ring-like member.

6. The method according to claim 4, in which the grooves are formed by wire-cutting electric discharge machining.

7. A method of manufacturing an electrostatic deflecting electrode unit, for use in charged beam lithography apparatus, in which a pair of electrodes opposed to each other is used as a base unit and N (N being an integer of two or more) number of such electrode pairs are placed around a center axis, the method comprising the steps of:

forming grooves of a predetermined width in a cylindrical member made of a metal, bored with a center hole and coated with a nonconductive oxide film in the direction of radius thereof and along lines that equally divides the periphery of the cylindrical member into 2N sections, the cylindrical member having small-in-diameter portions in its end portions and a large-in-diameter portion in its central portion;

attaching a first ring-like member to end surfaces of the large-in-diameter portion of cylindrical member which are opposed to each other in the direction of the center axis of the cylindrical member;

dividing the cylindrical member into 2N electrodes by extending the bottom portions of the grooves in the direction of radius of the cylindrical member to reach the hole of the cylindrical member with the first ring-like members attached;

cleaning the 2N electrodes with the first ring-like members attached, attaching second ring-like members to end surfaces of the small-in-diameter portions at both ends of the cylindrical member, then detaching the first ring-like members and cleaning the electrodes;

coating exposed surfaces of each of the electrodes which are held by the second ring-like members are attached with a conductive film, performing cleaning and baking at a predetermined temperature, and then performing cleaning and backing at a predetermined temperature with the first ring-like members attached after the second ring-like members are detached; and attaching third ring-like members of an insulating material to the end surfaces of the large-in-diameter portion of the cylindrical member which are opposed to each other in the direction of axis of the cylindrical member and then detaching the second ring-like members.

8. The method according to claim 7, in which each of the ring-like members is attached to a corresponding end surface of the cylindrical member by turning male screws into threaded holes formed coaxially at regularly spaced intervals in the end surface through corresponding threaded holed formed in the ring-like member.

9. The method according to claim 7, in which the grooves are formed by wire-cutting electric discharge machining.

10. The method according to claim 7, in which the first and second members are made of the material as the cylindrical member.

11. The method according to claim 7, in which the first and second ring-like members are made of a material which is close in thermal expansion coefficient to the cylindrical member.

12. An electrostatic deflecting electrode unit for use in charged beam lithography apparatus, the electrode unit comprising:

2N electrodes formed by cutting a hollow cylindrical metal member along lines that dividing the periphery of the cylindrical member into 2N equal sections; and ring-like insulating members attached to end surfaces of the 2N electrodes which are opposed in the direction of axis of the cylindrical member for supporting the electrodes.

13. The electrode unit according to claim 12, in which threaded holes are formed coaxially at regular intervals in each of the end surfaces of the electrodes, and each of the ring-like members has threaded holes each corresponding to a respective one of the threaded holes in the end surfaces of the electrodes, the ring-like members being attached to the end surfaces of the electrodes by turning male screws into the threaded holes in the end surfaces of the electrodes through the threaded holes in the ring-like members.

14. The electrode unit according to claim 12, in which the surfaces of the electrodes are coated with a conductive film.

* * * * *